United States Patent
Harding

(10) Patent No.: US 6,920,162 B2
(45) Date of Patent: Jul. 19, 2005

(54) ELECTRONIC OR OPTO-ELECTRONIC PACKAGES

(75) Inventor: Ryan Kingsley Harding, Bexhill-On-Sea (GB)

(73) Assignee: Agilent Technologies, Inc., Palo Alto, CA (US)

( * ) Notice: Subject to any disclaimer, the term of this patent is extended or adjusted under 35 U.S.C. 154(b) by 68 days.

(21) Appl. No.: 10/288,367

(22) Filed: Nov. 6, 2002

(65) Prior Publication Data
US 2003/0086243 A1 May 8, 2003

(30) Foreign Application Priority Data
Nov. 6, 2001 (EP) ............................................. 01309409

(51) Int. Cl.[7] ................................................. H01S 3/04
(52) U.S. Cl. ............................ 372/36; 372/31; 372/109
(58) Field of Search ............................ 372/31, 36, 109; 165/80.2, 80.3, 104.33

(56) References Cited

U.S. PATENT DOCUMENTS

| 4,768,070 | A | * | 8/1988 | Takizawa et al. | 372/36 |
|---|---|---|---|---|---|
| 4,901,324 | A | * | 2/1990 | Martin | 372/36 |
| 4,901,325 | A | * | 2/1990 | Kato et al. | 372/44 |
| 4,954,853 | A | * | 9/1990 | Yoshida et al. | 372/36 |
| 5,022,035 | A | * | 6/1991 | Hasegawa | 372/36 |
| 5,162,974 | A | * | 11/1992 | Currie | 361/702 |
| 5,371,753 | A | * | 12/1994 | Adsett | 372/36 |
| 5,500,768 | A | * | 3/1996 | Doggett et al. | 359/652 |
| 5,519,720 | A | * | 5/1996 | Hirano et al. | 372/36 |
| 5,675,597 | A | * | 10/1997 | Shigihara | 372/36 |
| 6,021,044 | A | * | 2/2000 | Neville et al. | 361/700 |
| 6,252,726 | B1 | * | 6/2001 | Verdiell | 359/820 |
| 6,410,904 | B1 | * | 6/2002 | Ito et al. | 250/214 R |
| 6,517,221 | B1 | * | 2/2003 | Xie | 362/373 |
| 6,563,696 | B1 | * | 5/2003 | Harris et al. | 257/675 |
| 2002/0054615 | A1 | * | 5/2002 | Nagamatsu et al. | 372/36 |
| 2003/0021310 | A1 | * | 1/2003 | Harding | 372/36 |
| 2003/0063439 | A1 | * | 4/2003 | Wei et al. | 361/703 |
| 2003/0086243 | A1 | * | 5/2003 | Harding | 361/700 |

FOREIGN PATENT DOCUMENTS

| EP | 1282206 A1 | * | 2/2003 | ........... H01S/5/022 |
|---|---|---|---|---|
| EP | 1309048 A1 | * | 5/2003 | ........... H01S/5/024 |
| JP | 2001-44554 | | 2/2001 | |
| WO | 99/16136 | | 4/1999 | |

OTHER PUBLICATIONS

EPO Abstract of Japanese Patent 2001044554, Publication Date Feb. 16, 2001.
EPO Abstract of Japanese Patent 08242041, Publication Date Sep. 17, 1996.

* cited by examiner

Primary Examiner—Minsun Oh Harvey
Assistant Examiner—Cornelius H. Jackson

(57) ABSTRACT

An electronic device such as a laser diode is mounted on a heatsink assembly within a TO-can package. The heatsink assembly is mounted in heat exchange relation with a heat pipe by being on or adjacent a heat pipe. The heat pipe is either attached to an exterior face of the TO-can package or passes into the TO-can package to efficiently draw heat away from the heatsink assembly.

15 Claims, 2 Drawing Sheets

ELECTRONIC OR OPTO-ELECTRONIC PACKAGES

FIELD OF THE INVENTION

This invention relates, in general, to electronic or opto-electronic packages and more particularly to laser electronic packages having optical devices, such laser diodes, mounted therein.

BACKGROUND OF THE INVENTION

Electronic and opto-electronic devices usually consume power which leads to an increase in temperature which affects the ability of the device to function in an optimum manner and shortens the life of the device. Active electronic devices are particularly susceptible to retaining substantial heat energy, but passive electronic devices can also be victim to this where the device absorbs heat energy from nearby heat sources or emissive devices.

In the field of optical electronic packages, it is known to utilise various types of cooling (or drawing heat energy away from the device) For example, laser diodes are often housed within so-called "Transistor Outline (TO)-Cans", which are metallic, generally cylindrically-shaped housings. The laser diode is typically mounted on an electrically insulating, thermally conductive device carrier, which is mounted on a heatsink pillar attached to the "lid" of the housing, providing a conductive path for thermal energy. The "lid", which is usually known as a "header", or a "CD header", is thermally coupled to the heatsink pillar. The heatsink pillar conducts thermal energy into the header of the housing which, in turn, dissipates the thermal energy away. Often, an electrical ground pin (or case pin) is attached to the header on the opposite side of the header to the heatsink pillar. Some of the thermal energy can then pass straight through the header to the ground pin, from which it can then be conducted away. However, the conduction of the thermal energy through the heatsink pillar to the ground pin via the header is not very efficient, and neither is the conduction of the thermal energy through the ground pin. Cooling can be especially poor when the TO-can is enclosed within a module together with a printed circuit board (PCB) which may have other heat-radiating devices mounted thereon.

Therefore, it is an object of the present invention to provide an electronic or opto-electronic package which overcomes, or at least reduces the disadvantages of the known devices described above.

BRIEF SUMMARY OF THE INVENTION

Accordingly, the present invention provides an electronic or opto-electronic package comprising an electronic or opto-electronic device, mounted on a heatsink assembly, the heat sink assembly being mounted within a package having a can body and a can header, and a heat pipe extending from a major exterior surface of the can header adjacent the heatsink assembly and being thermally coupled to the heatsink assembly.

The heat pipe preferably extends through the can header and forms part of the heatsink assembly. In a preferred embodiment, the heatsink assembly comprises a thermally conductive device carrier, which is mounted on the heat pipe adjacent an end thereof. The heat pipe preferably forms a mounting pillar to mechanically support the device carrier and the electronic or opto-electronic device.

In an alternative embodiment, the heat pipe is attached to the exterior of the can header, preferably on its lower face, adjacent the heatsink assembly. The heatsink assembly preferably comprises a thermally conductive device carrier, which is mounted on a thermally conductive pillar, which is attached to the interior of the can header, on its top, interior face, adjacent the heat pipe.

In a second aspect, the invention provides an electronic or opto-electronic package comprising an electronic or opto-electronic device mounted on a heatsink assembly, the heat sink assembly being mounted within a package housing, and a heat pipe extending from outside of the package housing into the package housing and forming part of the heatsink assembly.

Preferably, the heatsink assembly comprises a thermally conductive device carrier, which is mounted on the heat pipe.

The device is preferably a laser device, and the package Is preferably a Transistor Outline (TO)-Can.

Preferably, an end of the heat pipe remote from the can header is coupled to a thermal sink. The heat pipe is preferably electrically conductive and can be used to provide an electrical connection.

BRIEF DESCRIPTION OF THE DRAWINGS

Two embodiments of the present invention will now be described, by way of example, with reference to the accompanying drawings, of which.

DETAILED DESCRIPTION OF THE DRAWINGS

Figure 1:
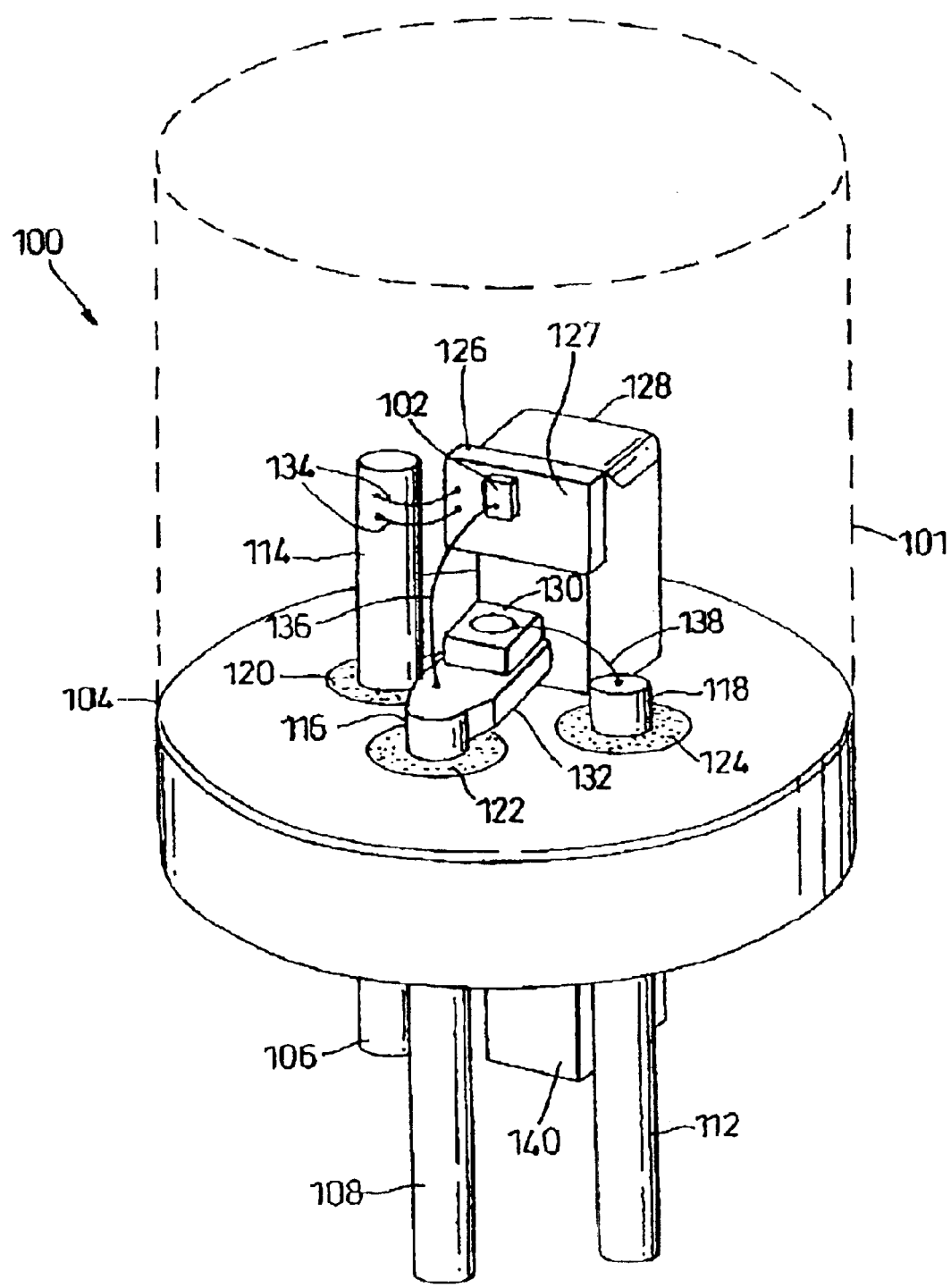
FIG. 1 is an illustration of a first embodiment of the present invention showing a perspective view of the interior of a TO-Can package having a laser diode mounted therein.

Thus, FIG. 1 shows an electronic package 100 having a laser diode 102 mounted in a TO-Can body 101, with further Components (not shown) being housed in other parts of the body 101. The TO-Can body 101 is generally cylindrical and is hermetically sealed to a TO-Can header 104 having three electrical pins 106, 108, 112, which pass through the central part of the header 104 to an internal portion of the TO-Can body 101 for connection to the electrical components therewithin. The TO-Can body and the TO-Can header thus provide a housing of the electronic package.

Each of the three pins 106, 108, 112 is held in position by a glass seal 120, 122, 124 surrounding the respective pin where it passes through the TO-Can header 104. A cathode pin 106 terminates in the form of a cathode 114 on an internal side of the TO-Can header 104, an anode pin 108 terminates in the form of an anode 116 on the internal side of the TO-Can header 104, and a photodiode pin 112 terminates in the form of a photodiode terminal 118 on the internal side of the TO-Can header 104.

Specifically the laser heatsink assembly comprises a device carrier 126 that is metal-plated on a front surface 127, and whose bulk is composed of Silicon Carbide (SiC) or Aluminum Nitride (AlN), which is thermally conductive and electrically insulating, attached to a surface of a laser heatsink pillar 128, with laser diode 102 being located on the metal-plated surface 127 of the device carrier 126. The anode 116 of anode pin 108 terminates in a metal tab 132, which extends below the laser diode 102 and has a photodiode 130 positioned thereon. A pair of bond wires 134 couple the cathode 114 to the metal-plated surface 127 of the device carrier 126, which is electrically coupled to the base of the laser diode 102, a bond wire 136 couples the laser diode 102 to the anode 116, and a further bond wire 138 couples the anode of the photodiode 130 to the photodiode terminal 118. The cathode of the photodiode 130 is electrically attached to the metal tab 132, such that the photodiode is reverse biased.

Figure 2:
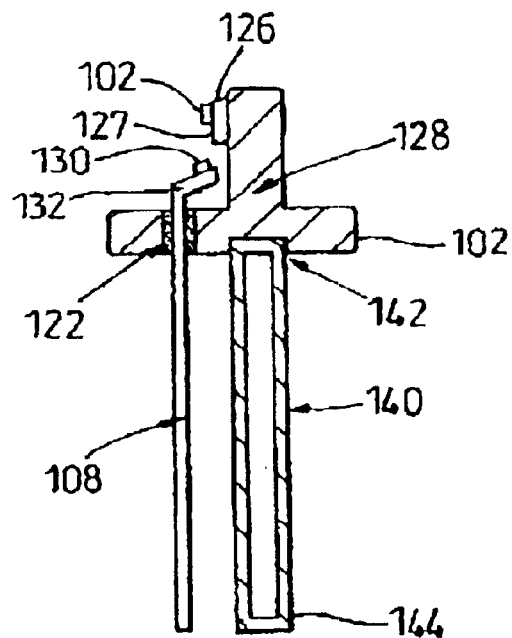
FIG. 2 shows a schematic cross-sectional view of the embodiment of FIG. 1 in which a heatpipe is attached to a bottom face of the TO-Can package.

A laser heatsink pin 140 is brazed to the header 104 adjacent to the laser heatsink assembly so that thermal energy from the heatsink pillar 128 is conducted to the heatsink pin 140 and hence away from the package 100. As best shown in FIG. 2, the laser heatsink pin 140 is formed by a heat pipe, which is slightly sunk into the lower face of the header 104 so that a first end 142 of the heat pipe is in heat exchange relation with a heatsink assembly by being as close as possible to the lower end of the heatsink pillar 128. It will be appreciated that, for simplicity, FIG. 2 shows a simplified cross-sectional view through the TO-can package, but does not show all the elements of the assembly of FIG. 1, but only parts of the internal structure thereof. In particular, pins 106 and 112 are not shown, and neither are the wire bonds.

The heat pipe 140 works on a well-known principle to transfer heat at a substantial rate across a small temperature gradient. The thermal energy generated by components within the TO-can package 100 is conducted into the first end 142 of the heat pipe 140 through the header 104. The heat pipe 140 comprises a sealed tube, typically of copper, which is evacuated and charged with a phase change liquid. The liquid at the first end 142, known as the evaporator, absorbs thermal energy and, as the liquid gets hotter, evaporation occurs. The vapour moves to a second end 144, known as the condenser, of the heat pipe 140 away from the package 100 where it condenses due to a transfer of thermal energy from the vapour to this relatively coot second end 144 of the heat pipe, from where it disperses, preferably into some form of thermal sink (not shown). The liquid returns to the first end 142 of the heat pipe 140 by capillary action utilising a "wick" action. However, it will be appreciated by the skilled artisan that the TO-can package 100 and the heat pipe 140 are generally in dynamic equilibrium and therefore the fluid in the first end 142 of the heat pipe 140 experiences net evaporation and the fluid in the second end 144 of the heat pipe 140 experiences net condensation. Due to the difference in vapour pressure, there is a net flow of vapour from the first end 142 to the second end 144 and a net flow of liquid from the second end 144 to the first end 142. The heat pipe is thus quite efficient at removing heat from the "hot" first end 142, since the latent heat of vaporisation is used to draw thermal energy away.

In operation of the device, an input signal is applied to the cathode 114 and a supply voltage is applied to the anode 116. Light energy and heat energy are emitted from the laser diode 102 and the heat energy is mainly conducted into the laser device carrier 126 from where it is conducted to the heatsink pillar 128. The heat energy is then conducted through the TO-Can header 104 into the first end 142 of the heat pipe 140 and subsequently into the second end 144 thereof, from where it is dissipated.

Figure 3:
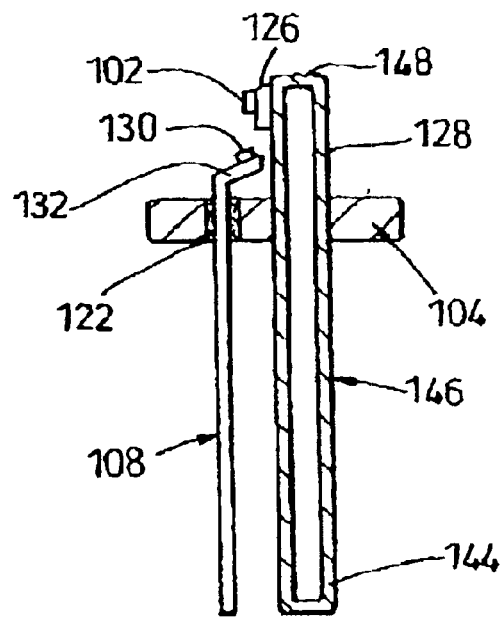
FIG. 3 shows a schematic cross-sectional view of a second embodiment of the invention in which a heatpipe extends through a bottom face of the TO-Can package, forming a heatsink pillar, which supports the device carrier, which supports the device.

FIG. 3 shows a simplified cross-sectional view through a second embodiment of the TO-can package, similar to the view of FIG. 2, with the same elements having the same reference numbers as in FIG. 2. In this embodiment, however, instead of the heat pipe 140 being brazed to the CD header 104 as in the embodiment of FIG. 2, the heat pipe 146 passes through the CD header 104 into the interior of the TO-can 100 and forms the heatsink pillar 128. In this way, the first end 148 of the heat pipe 146 actually forms part of the heatsink assembly and is therefore more efficient at removing thermal energy from the TO-can 100. The heat pipe 146, in this case, has the device carrier 126 mounted on it adjacent the first end 148 so that thermal energy from the heatsink block 126 is conducted directly into the first end 148 of the heat pipe 146 from where it is transferred by the heat pipe to its second end 144, as before and dispersed, preferably into some form of thermal sink (not shown). The heat pipe 146 is, of course, appropriately connected to the CD header 104 where it passes through the header 104 and is preferably hermetically sealed thereto in any desired manner, which can be by brazing, or by using glass seals.

It will be appreciated that a person skilled in the art can make modifications and improvements in the above described embodiments without departing from the scope of the present invention. For example, it will be appreciated that the condenser end 144 of the heat pipe could be fitted with fins for heat-exchange with the air if desired. It will also be appreciated that the heat pipe can be employed as an electrical connection, such as a ground or case connection, which might be arranged to serve as part of the principal current path to the laser diode or photo diode or as part of the electromagnetic shielding.

What is claimed is:

1. An opto-electronic device comprising:
   a housing including a header and a body carried by the header, the housing having an interior volume including interior surfaces of the header and body, the interior volume including (a) circuit elements, one of the circuit elements including a laser, at least some of the circuit elements other than the laser being arranged for supplying power to the laser and (b) a first heat sink portion on which the laser is mounted so that the laser is in thermal contact with the first heat sink portion;
   a plurality of electrical pins for supplying electric power to the circuit elements, the plurality of electrical pins being carried by the header, the plurality of electrical pins extending from outside of the interior volume through the header and connected in the interior volume to the circuit elements;
   a heat pipe forming a second heat sink portion, the first and second heat sink portions being in heat exchange relation with each other and arranged for removing heat from the laser; the heat pipe being carried by the header and having (a) a liquid condenser portion outside of and remote from the interior volume and (b) a liquid evaporation portion in proximity to and in heat exchange relation with the first heat sink portion.

2. The opto-electronic device of claim 1 wherein the plurality of electrical pins and the heat pipe extend in generally the same direction from the header away from the interior volume of the housing.

3. The opto-electronic device of claim 1 further including an optical detector within the interior volume, some of the circuit elements also coupling electricty between the electrical pins and the optical detector.

4. The opto-electronic device of claim 1 wherein the heat pipe is arranged so the liquid evaporation portion of the heat pipe extends into the interior volume of the housing.

5. The opto-electronic device of claim 4 wherein the heat liquid evaporation portion of the heat pipe extending into the interior volume of the housing carries the first heat sink portion on which the laser is mounted.

6. The opto-electronic device of claim 5 wherein the first heat sink portion on which the laser is mounted includes a body that is (a) a thermal conductor and (b) an electrical insulator, the body having a metal plated surface on which the laser is located.

7. The opto-electronic device of claim 1 wherein the heat pipe is arranged so the liquid evaporation portion of the heat pipe contacts the header without extending into the interior volume of the housing.

8. The opto-electronic device of claim 7 wherein the first heat sink portion includes (a) a heat sink pillar within the interior volume and (b) a structure within the interior volume carrying the laser, the heat sink pillar carrying the structure carrying the laser, the heat sink pillar being carried by the header, the heat sink pillar and the structure carrying the laser being in heat exchange relation with each other.

9. The opto-electronic device of claim 8 wherein the structure carrying the laser includes a body that is (a) a thermal conductor and b) an electrical insulator, the body having a metal plated surface on which the laser is located.

10. An electronic device comprising:
a housing having an interior volume, the interior volume including (a) a component for consuming electric power and generating heat, (b) circuit elements for supplying electric power to the component, and c) a first heat sink portion on which the component is mounted so that the component is in thermal contact with the first heat sink portion;
a plurality of electrical pins for supplying electric power to the circuit elements and to the component, the plurality of electrical pins being carried by the housing, the plurality of electrical pins extending from outside of the interior volume through the housing and connected in the interior volume to the circuit elements;
a heat pipe forming a second heat sink portion, the first and second heat sink portions being in heat exchange relation with each other and arranged for removing heat from the component; the heat pipe being carried by the housing and having (a) a liquid condenser portion outside of and remote from the interior volume and (b) a liquid evaporation portion in proximity to and in heat exchange relation with the first heat sink portion.

11. The device of claim 10 wherein the heat pipe is arranged so the liquid evaporation portion of the heat pipe contacts the housing without extending into the interior volume of the housing.

12. The device of claim 11 wherein the first heat sink portion includes (a) a heat sink pillar within the interior volume and (b) a structure within the interior volume carrying the component, the heat sink pillar carrying the structure carrying the component, the heat sink pillar being carried by the housing, the heat sink pillar and the structure carrying the component are being in heat exchange relation with each other.

13. The device of claim 10 wherein the heat pipe is arranged so the liquid evaporation portion of the heat pipe extends into the interior volume of the housing.

14. The device of claim 13 wherein the heat liquid evaporation portion of the heat pipe extending into the interior volume of the housing carries the first heat sink portion on which the component is mounted.

15. The device of claim 13 wherein the component includes a laser.

* * * * *